(12) United States Patent
Nickel et al.

(10) Patent No.: US 6,288,417 B1
(45) Date of Patent: Sep. 11, 2001

(54) LIGHT-EMITTING DEVICES INCLUDING POLYCRYSTALLINE GAN LAYERS AND METHOD OF FORMING DEVICES

(75) Inventors: Norbert H. Nickel, Zossen (DE); Christian G. Van de Walle, Sunnyvale, CA (US); David P. Bour, Cupertino, CA (US); Ping Mei, Palo Alto, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/226,114

(22) Filed: Jan. 7, 1999

(51) Int. Cl.⁷ .................................................. H01L 33/00
(52) U.S. Cl. .............................. 257/103; 257/96; 257/94; 257/76; 257/190
(58) Field of Search ................................... 257/103, 190, 257/76, 94, 96

(56) References Cited

U.S. PATENT DOCUMENTS 6,064,078 * 3/2000 Northrup et al. ..................... 257/103

OTHER PUBLICATIONS

S. Nakamura et al., "Candela–class High Brightness InGaN/AlGaN Double–heterostructure Blue–light–emitting Diodes", Appl. Phys. Lett. 64 (13), 1994, pp. 1687–1689.
S. Nakamura et al., "High–Brightness InGaN Blue, Green and Yellow Light–Emitting Diodes with Quantum Well Structures", Jpn. J. Appl. Phys. 34, 1995, pp. L797–L799.
S. Nakamura, "Blue–Green Light–Emitting Diodes and Violet Laser Diodes", MRS Bulletin, 1997, pp. 29–35.
I. Akasaki et al., "Widegap Column–III Nitride Semiconductors for UV/Blue Light Emitting Devices", J. Electrochem. Soc., 141(8), 1994, pp. 2266–2271.
S. Lester et al., "High Dislocation Densities in High Efficiency GaN–based Light–Emitting Diodes", Appl. Phys. Lett. 66 (10), 1995, pp. 1249–1251.
D. Bour et al., "Characterization of OMVPE–Grown AlGaInN Heterostructures", Materials Research Society, 1996, pp. 1–10.
S. Kitamura et al., "Fabrication of GaN Hexagonal Pyramids on Dot–Patterned GaN/Sapphire Substrates via Selective Metalorganic Vapor Phase Epitaxy", Jpn. J. Appl. Phys. 34, 1995, pp. L1184–L1186.
Index of Powder X–Ray Diffraction Spectra, Joint Committee on Powder Diffraction Standards, 1976.

* cited by examiner

Primary Examiner—Fetsum Abraham
(74) Attorney, Agent, or Firm—Oliff & Berridge, PLC (57) ABSTRACT

Polycrystalline group III-nitride semiconductor materials such as GaN and alloys of GaN and other group III-nitrides are deposited as layers on polycrystalline and non-crystalline substrates. The polycrystalline GaN layers can be formed by solid-phase crystallizing amorphous material or by directly depositing polycrystalline material on the substrates. The polycrystalline GaN material can be incorporated in light-emitting devices such as light-emitting diodes (LEDs). LED arrays can be formed on large-area substrates to provide large-area, full-color active-matrix displays.

45 Claims, 7 Drawing Sheets

LIGHT-EMITTING DEVICES INCLUDING POLYCRYSTALLINE GAN LAYERS AND METHOD OF FORMING DEVICES

BACKGROUND OF THE INVENTION

1. Field of Invention

This invention is directed to semiconductor light-emitting devices. More particularly, this invention is directed to semiconductor light-emitting devices that include polycrystalline GaN.

2. Description of Related Art

Group-III nitrides include elements from group III of the periodic table, i.e., Al, Ga and In. These materials are deposited over substrates to form layered structures for optoelectronic devices. The devices can emit visible light over a wide range of wavelengths. GaN and its alloys with InN and AlN can be used in visible light-emitting devices that produce high emission efficiencies. Crystalline heterostructures of these materials are typically deposited epitaxially on single-crystal substrates by vapor phase epitaxy techniques. For example, full-color outdoor displays can be formed by combining existing red emitters and blue and green InGaN/AlGaN light-emitting diodes (LEDs).

LEDs have been produced that can emit all three primary colors (red, green, blue). These devices have potential utility for large-area displays. By mixing two or more colors, a range of intermediate colors can potentially be produced in such displays.

Single crystal group III-nitride LEDs have a high emission efficiency despite having high defect concentrations. These materials can have dislocation densities of $\sim 10^{10}$ cm$^{-2}$. These extended defects apparently do not influence carrier flow and recombination in devices that are fabricated from these materials. This insensitivity is surprising in light of the known adverse effects that extended (i.e., one and two-dimensional) lattice defects, such as dislocations and stacking faults, normally have on the optoelectronic properties of semiconducting materials.

SUMMARY OF THE INVENTION

The potential use of known LEDs based on single-crystal LED materials in full-color displays is limited by the need to deposit these materials on single-crystal substrates. Known single crystal substrates including sapphire and silicon carbide have been formed only with limited areas. Accordingly, the size of displays that can be formed by depositing single crystal materials on such single-crystal substrates is limited as well. In addition, the number of suitable materials for forming single-crystal substrates for depositing group III-nitride semiconductor structures is limited.

This invention provides polycrystalline group III-nitride semiconductor materials. This invention separately provides light-emitting diodes (LEDs) and other light-emitting devices that comprise polycrystalline group III-nitride layers.

The polycrystalline group III-nitride materials include GaN and alloys of GaN with other group III-nitrides such as AlN and InN. These materials can be used in visible light-emitting devices to provide efficient light emission.

One exemplary semiconductor structure according to this invention comprises a polycrystalline, substantially non-crystalline or amorphous substrate and at least one polycrystalline group III-nitride layer formed over the substrate. The polycrystalline group III-nitride layer can be formed on the substrate, i.e. directly upon the substrate. This polycrystalline group III-nitride layer is formed by first depositing amorphous group III-nitride material on the substrate, and then solid-phase crystallizing the amorphous material to form a polycrystalline group III-nitride layer. The amorphous group III-nitride layer is formed by a low temperature deposition technique on the substrate.

Alternatively, polycrystalline group III-nitride layers can be formed over one or more underlying layers formed prior to depositing the group III-nitride layers. These group III-nitride layers are deposited directly as polycrystalline layers without first depositing amorphous material as described above. A wetting (nucleation) layer can be deposited initially on the substrate to enhance deposition of subsequently formed layers over the substrate. The polycrystalline group III-nitride layer can then be formed on the wetting layer, or on other underlying layers such as buffer layers.

The light-emitting devices according to this invention comprise a polycrystalline, substantially non-crystalline or amorphous substrate and p-type and n-type polycrystalline group III-nitride layers formed over the substrate.

The light-emitting devices according to this invention can also comprise an active layer of a suitable polycrystalline group HI-nitride material. This active layer can be deposited between the p-type and n-type polycrystalline group III-nitride layers. This active layer enhances electrical carrier recombination.

To enhance carrier confinement, the light-emitting devices can comprise one or more confinement layers which are formed on the active layer. The confinement layers can comprise a group III-nitride material.

As described above, the polycrystalline p-type and n-type group III-nitride layers and active layer can be initially formed as amorphous layers and subsequently solid-phase crystallized to form polycrystalline material. The low-temperature deposition of the amorphous layers can enhance the incorporation of indium in InGaN active layers, enabling the active layer to emit visible light at the longer wavelengths.

Alternatively, the group III-nitride layers can be formed on the substrate as polycrystalline layers at higher deposition temperatures. In embodiments, a wetting layer can be initially deposited on the substrate to enhance sticking of gallium nitride to the substrate at the higher temperatures.

According to another aspect of this invention, the LEDs be used in large-area color displays. The displays can be monochromatic or multi-color displays. The displays comprise a substrate and a pixel array on the substrate. The substrates are polycrystalline, substantially non-crystalline or amorphous, and can have relatively large areas as compared to single crystal substrates. The polycrystalline group III-nitride layers deposited on the substrates enable enhanced structural flexibility. The pixels each comprise a light-emitting device according to this invention formed on the substrate. The light-emitting devices can emit violet or near-UV light, or alternatively visible light of a selected color.

In multi-color displays according to this invention, each pixel can emit a selected color. The pixels can comprise a red, green or blue phosphor. The phosphors can be formed either over the light-emitting devices or on the opposite surface of the substrate. The displays comprise n-electrodes (address electrode) and a plurality of separately addressable p-electrodes (control electrodes) over the light-emitting devices. The phosphors are each tuned to absorb light emitted by the light-emitting device and to re-emit light at a selected wavelength. Accordingly, the pixels can emit three different primary colors to provide a full-color, large area display.

This invention also provides methods of making the above-described semiconductor structures, light-emitting devices and displays.

These and other features and advantages of this invention are described in, or are apparent from, the following detailed description of the structures, devices and methods according to this invention.

BRIEF DESCRIPTION OF THE DRAWINGS

Various embodiments of this invention will described in detail, with reference to the figures, wherein.

DETAILED DESCRIPTION OF PREFERRED EMBODIMENTS

Figure 1:
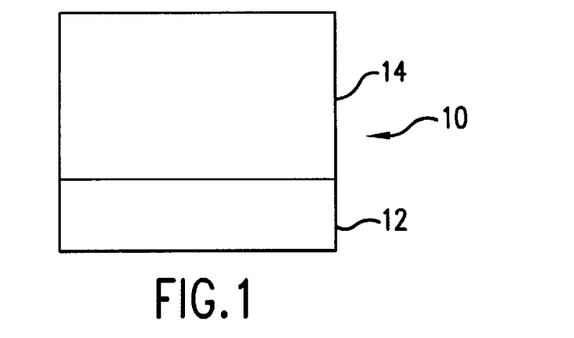
FIG. 1 illustrates an exemplary layered semiconductor structure according to this invention.

FIG. 1 illustrates an exemplary semiconductor structure 10 according to this invention. The semiconductor structure comprises a substrate 12 and a group III-nitride 14 layer formed over the substrate 12. According to an aspect of this invention, the substrate 12 can be polycrystalline, substantially non-crystalline or amorphous. For example, the substrate 12 can comprise, for example, quartz or silica glass. These materials can provide substrates of larger area than known single-crystal substrate materials such as sapphire and silicon carbide that are used as substrates for epitaxial deposition of single-crystal layered structures.

The group III-nitride layer 14 is polycrystalline. The group III-nitride layer 14 can comprise GaN, as well as ternary or quaternary alloys of GaN with AlN and InN. For example, the group III-nitride can be $In_xGa_{1-x}N$. Such alloys enable the emission of light covering the entire visible spectrum depending on the value of x, and thus the In content.

According to an aspect of this invention, the group III-nitride layer 14 can be deposited as an amorphous layer on the substrate 12. Subsequently, the amorphous layer can be treated by a suitable energy source to crystallize the amorphous layer to form a polycrystalline group III-nitride layer 14. The polycrystalline layer may be capable of light emission efficiencies that are comparable to those that have been achieved with crystalline group III-nitride structures, such as those comprising crystalline GaN and its alloys.

The amorphous group III-nitride layer 14 can be formed on the substrate 12 by a suitable deposition process. For example, amorphous group III-nitride layers can be deposited on substrates by MOCVD (metal organic chemical vapor deposition) that is typically used to grow epitaxial single-crystal material. Other known or later developed deposition methods that enable deposition of group III-nitride layers over relatively large substrate areas can also be used. For example, reactive sputtering of amorphous and microcrystalline GaN on quartz substrates has been reported in S. Nonomura et al., "Photoconductive a-GaN prepared by reactive sputtering," J. Non-Cryst. Solids 198–200 (1996) 174–177, incorporated herein by reference in its entirety.

Amorphous group III-nitride layers can also be formed at relatively low substrate temperatures and high deposition rates. For example, MOCVD can be used to grow amorphous GaN on quartz substrates at substrate temperatures of about 500–600° C.

Suitable gas-source precursors for forming amorphous GaN (or polycrystalline GaN, as described below) include trimethyl gallium ($Ga(CH_3)_3$) and ammonia ($NH_3$). Ternary alloys can be formed by the addition of suitable gas-source precursors. For example, InGaN can be grown by the addition of trimethyl indium.

The use of low growth temperatures to form the amorphous group III-nitride layers can enhance the amount of some elements that can be incorporated into ternary alloy layers. For example, GaN can be alloyed with InN to extend the band gap of InGaN ternary alloys into the red, allowing the entire visible spectrum to be effectively covered. In a single crystal material, however, it is difficult to obtain InGaN alloys having a sufficiently high indium content using conventional deposition techniques. This is due to miscibility problems that produce segregated In-rich regions and Ga-rich regions in these layers. Low-temperature deposition of InGaN can enhance the incorporation of indium, thereby producing alloys that cover an extended portion of the visible spectrum. In addition, low-temperature deposition reduces problems associated with the high vapor pressure of InN.

According to an aspect of this invention, the amorphous group III-nitride layer formed on the substrate can be solid-phase crystallized by laser cystallization. For example, amorphous GaN can be crystallized using suitable lasers, such as excimer lasers. Those skilled in the art will understand that the laser fluence and the number of applications of the laser beam to the amorphous materials can be varied to achieve satisfactory crystallization of amorphous group III-nitride materials.

Figure 2:
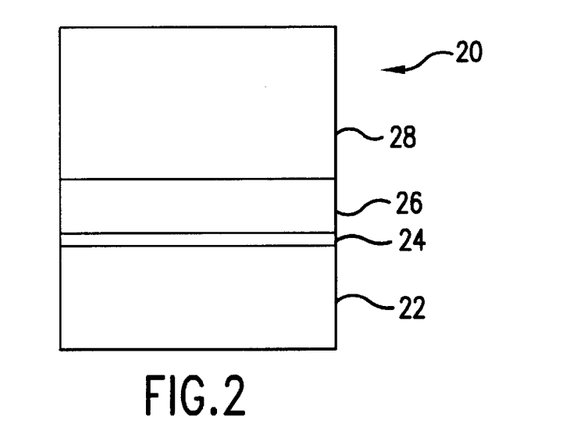
FIG. 2 illustrates another exemplary layered semiconductor structure according of this invention.

FIG. 2 illustrates another exemplary semiconductor layered structure 20 according to this invention. In this layered structure 20, group III-nitride layers are formed over the substrate as polycrystalline layers, without initially forming amorphous layers. These polycrystalline layers can be formed at higher substrate temperatures than the temperatures that are used to form the above-described amorphous layers.

The deposition of polycrystalline GaN on silica glass substrates by molecular beam epitaxy has been demonstrated by K. Iwata et al., as reported in "Gas Source Molecular Beam Epitaxy Growth of GaN on C-, A-, R- and M-Plane Sapphire and Silica Glass Substrates," Jpn. J. Appl. Phys., Vol. 36 (1997) Pt. 2, No. 6A, pp. 661–664, incorporated herein by reference in its entirety.

As shown in FIG. 2, to promote better coverage of the polycrystalline group III-nitride materials on the substrates, one or more intermediate layers 24, 26 are preferably formed between the substrate 22 and the group III-nitride layer 28. The intermediate layers can include a wetting layer 24 that enhances wetting by affecting surface and interface energetics. For example, to compensate for the low sticking coefficient of gallium on quartz and other suitable polycrystalline, substantially non-crystalline or amorphous substrates, a thin film of a suitable group III-nitride material such as AlN or GaN can be initially deposited on these substrates. This thin film can be deposited so that it is at most a single atom thick and covers only a portion of the substrate. That is, this thin film is a sub-monolayer. Alternatively, this wetting layer 24 can cover substantially the entire surface of the substrate surface 22. This wetting layer 24 acts as a nucleation layer and enables uniform coverage of the substrate by the overlying group III-nitride layers(s).

In addition to the thin film 24, one or more buffer layers 26 formed by a group III-nitride material, such as AlN, GaN, InGaN or AlGaN, can be deposited on the wetting layer 24. For example, a thin buffer layer 26 of amorphous GaN can be deposited on the wetting layer 24. Amorphous buffer layers can be deposited at a low temperature. The amorphous material subsequently undergoes solid-phase crystallization during a heating step prior to depositing the polycrystalline GaN. For example, the amorphous material can be crystallized by increasing the temperature in the deposition chamber to about 1050° C. Recrystallization can be conducted in a suitable atmosphere such as an $NH_3$—$H_2$ ambient atmosphere. The buffer layer typically has a thickness of from about 100–500 Å.

Some embodiments of the semiconductor structure of this invention may not include the buffer layer 26. Buffer layers are typically deposited in semiconductor structures to enhance lattice matching between the substrate and the layers subsequently grown over the substrate. In this invention, however, lattice matching between the substrate and deposited layers may not be as important a consideration as in semiconductor structures comprising single crystal substrates and thin films. The buffer layer can enhance coverage of the substrate by deposited layers. Accordingly, these buffer layers can be used for this and other known purposes.

The semiconductor layered structures 10, 20 illustrated in FIGS. 1 and 2, respectively, can be used in various light-emitting devices. As described in greater detail below, the semiconductor layered structures can be used, for example, in light-emitting diodes and colored displays. Those skilled in the art will readily appreciate that other applications may be possible as well.

Figure 3:
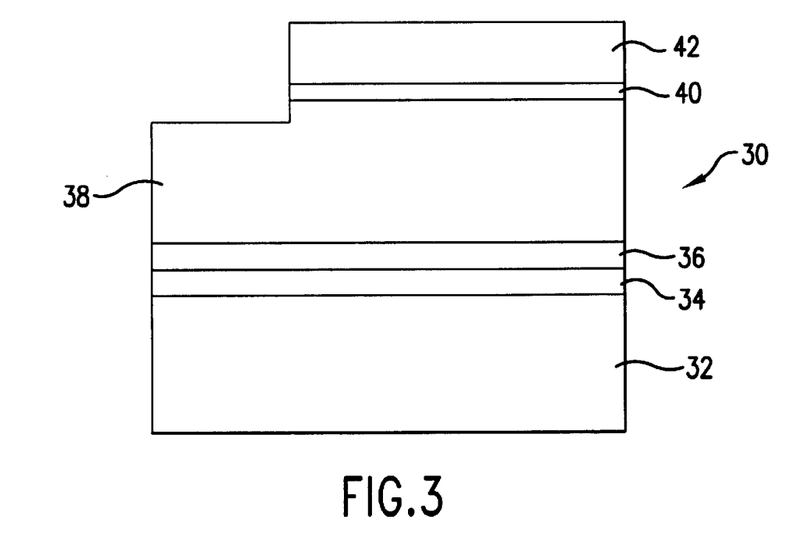
FIG. 3 illustrates an exemplary light-emitting device according to this invention.

FIG. 3 illustrates an exemplary light-emitting diode (LED) 30 according to this invention. The LED 30 comprises a substrate 32 that can be polycrystalline, substantially non-crystalline or amorphous. A thin wetting layer 34 is grown over the substrate 32. The wetting layer 34 can comprise any suitable group III-nitride material, such as AlN, as described above. A buffer layer 36 is formed over the wetting layer 34. The buffer layer 36 can comprise any suitable group III-nitride material, such as GaN or AlN, as also described above. The buffer layer 36 can be applied as an amorphous layer and then be solid-phase crystallized at a higher temperature to form a polycrystalline layer.

After the wetting layer 34 and the buffer layer 36 are deposited on or over the substrate, at least one n-type (or p-type) group III-nitride layer 38 is grown over the buffer layer 36. For example, the group III-nitride layer 38 can be n-type GaN formed by the incorporation of appropriate dopants during deposition of the n-type group III-nitride layer 38. Suitable n-type dopants for GaN include Si and the like.

An active layer 40 is grown over the n-type group III-nitride layer 38. The active layer 40 enhances electron-hole recombination efficiency. The active layer 40 can comprise an alloy, such as InGaN, designed to produce visible light at a desired wavelength. For example, the alloy can have the composition $In_{0.3}Ga_{0.7}N$, designed to produce blue light at a desired wavelength. The composition of the active layer 40 can be varied by adjusting the proportions of In and Ga to vary the bandgap of the active layer 40, thus tuning the wavelength of light that is emitted by the LED 30. The active layer 40 can have a thickness that is sufficiently small for quantum mechanical confinement effects to be important. Active layers 40 of such small thickness are known as quantum wells. The active layer 40 typically has a thickness of from about 10–100 Å.

As described in U.S. patent application Ser. No. 09/127,038, filed Jul. 31, 1998, and incorporated herein by reference in its entirety, the indium content of the InGaN active layer 40 can be enhanced by depositing the active layer 40 on a thick InGaN layer having a thickness of between about 0.5–100 $\mu$m. This approach can decrease InGaN alloy segregation in the active region at high indium contents, enhancing the purity of spectral emission by the LED 30.

As described in U.S. patent application Ser. No. 09/137,112, filed Aug. 20, 1998 and incorporated herein by reference in its entirety, $ZnGeN_2$ active layers can also be formed between group III-nitride layers such as GaN. $ZnGeN_2$ has a bandgap of about 2.7 eV, compared to a bandgap of about 3.4 eV for GaN.

A carrier confinement layer (not shown) can be formed above and/or below the active layer 40 to increase electrical carrier confinement. The confinement layer can comprise group III-V nitrides such as alloys of AlGaN.

A p-type group III-nitride layer 42 is formed over the active layer 40 (or over a carrier confinement layer in embodiments of the LED including such layer on the active layer 40). When the LED 30 includes a p-type group III-nitride layer formed below the active layer 40, an n-type group III-nitride layer is formed over the active layer 40 (or carrier confinement layer). Suitable p-type dopants for forming the layer 42 include magnesium and the like.

The light-emitting diode according to this invention can alternatively be formed by applying the n-type group III-nitride layer 38 directly on the substrate, without forming the intervening wetting layer 34 and/or the intervening buffer layer 36. In this case, the n-type group III-nitride layer 38, as well as the active layer 40 and the p-type group III-nitride layer 42, can be deposited as amorphous layers at low temperatures and subsequently solid-phase crystallized by the application of energy to the n-type and p-type group-III nitride layers 38 and 42 and the active layer 40. For example, the n-type and p-type group III-nitride layers 38 and 42 and the active layer 40 can be laser crystallized as described above. As stated above, low temperature deposition can enhance the incorporation of alloying elements such as indium into the active layer 40.

According to another aspect of this invention, light-emitting devices, such as the LED 30, according to this invention can be used in large area displays. This application is enabled by using polycrystalline, substantially non-crystalline or amorphous substrates in the light-emitting devices according to this invention. As stated above, these substrates can be provided in larger areas than single-crystal substrates, thereby enabling the production of larger area displays incorporating the light-emitting devices.

According to another aspect of this invention, the light-emitting devices according to this invention can be utilized in large-area monochromatic displays. Monochrome displays can emit light of a selected color dependent on the structure of the light-emitting devices according to this invention and the particular active layer that it includes.

Figure 4:
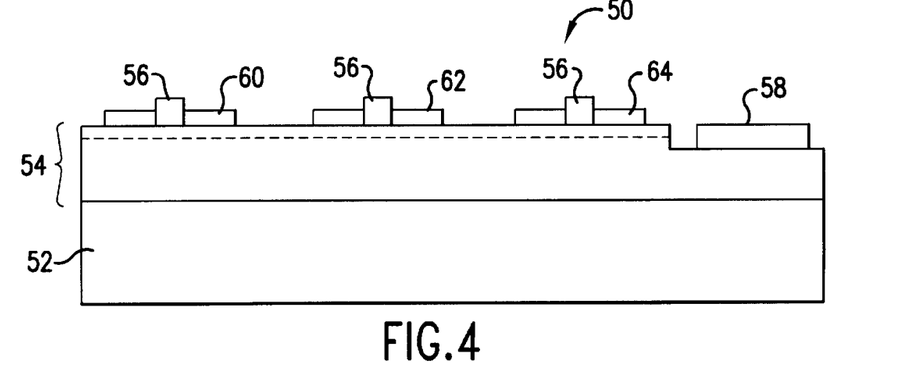
FIG. 4 illustrates an exemplary multi-color display according to this invention.
Figure 5:
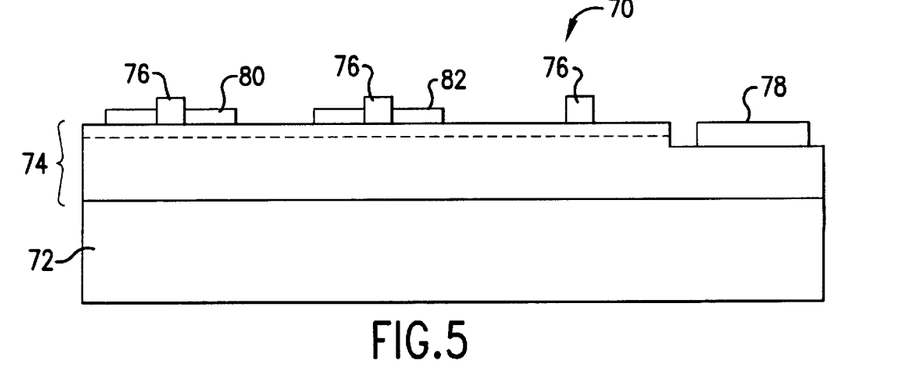
FIG. 5 illustrates another exemplary multi-color display according to this invention.
Figure 6:
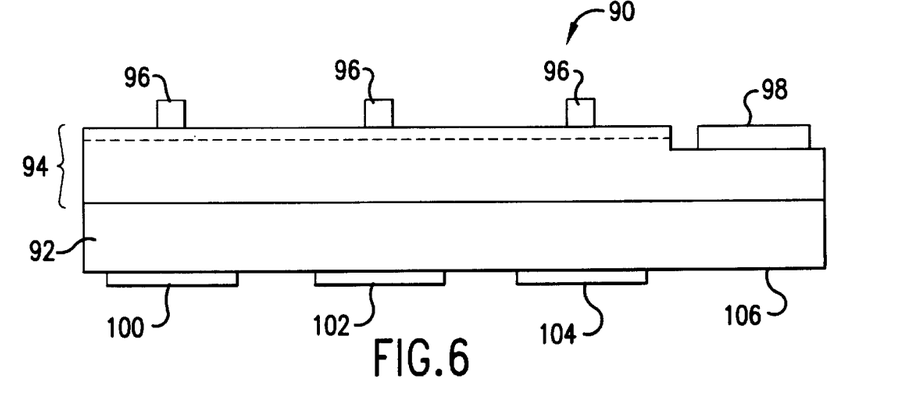
FIG. 6 illustrates another exemplary multi-color display according to this invention.

The light-emitting devices according to this invention can also be used in large-area, multi-color and full-color displays. FIG. 4 illustrates an exemplary full-color display 50 according to this invention. The display 50 can comprises a polycrystalline, substantially non-crystalline or amorphous substrate 52, such as a quartz or silica glass substrate. An array of polycrystalline light-emitting devices 54 are formed on the substrate 52. The light-emitting devices 54 according to this invention can be, for example, the LED 30 described above, and can be formed by conventional photolithography techniques known to those skilled in the art. The light-emitting devices 54 can emit light of a selected wavelength. For example, the light-emitting devices 54 can emit violet or near-ultraviolet light. The display 50 combines pixels that can each emit a selected color. As shown in FIGS. 4–6, various phosphor materials 60, 62 and 64 can be deposited on the light-emitting devices 54. These phosphor materials 60, 62 and 64 can be tuned to absorb light energy of the wavelength emitted by the light-emitting devices 54 and to emit light of a selected wavelength and color. For example, the phosphors 60, 62 and 64 can be excited to emit red, green and blue light, respectively, such that the display 50 can emit all colors.

In addition to the light-emitting devices 54, each pixel includes a separately addressable control electrode 56 associated with one of the phosphors 60, 62 and 64. The end contact may be a common electrode 58.

FIG. 5 shows another exemplary display 70 according to this invention. The display 70 comprises a substrate 72 and an array of light-emitting devices 74 according to this invention formed on the substrate. In this embodiment, the light-emitting devices 74 emit blue light directly. To enable the generation of all three primary colors, the display 70 also includes phosphors 80 and 82 that absorb blue light and re-emit red and green light, respectively. Accordingly, the display 70 can emit red, green and blue light. As shown, each pixel comprises a separately addressable control electrode 76. The display 70 also comprises a common electrode 78.

FIG. 6 shows another exemplary display 90 according to this invention. The display 90 comprises a substrate 92 and an array of light-emitting devices 94 formed on the substrate 92. Like the light-emitting devices 54, the light-emitting devices 94 emit violet or near-UV light. The substrate 92 is transparent. In contrast to the display 50, the display 90 comprises three phosphors 100, 102 and 104 formed on the bottom surface 106 of the substrate 92. The phosphors 100, 102 and 104 can emit red, green and blue light, respectively. Each pixel further comprises a separately addressable control electrode 96 over the light-emitting device 94. The display 90 also comprises a common electrode 98.

It will be understood by those skilled in the art that the colored displays according to this invention can be mono-chromatic displays. Such displays can comprise an array of light-emitting devices that emit light of some selected color such as blue light. Optionally, the light-emitting devices can emit violet or near-ultraviolet light and a single phosphor color (red, green or blue) can be associated with each light-emitting device.

It will also be understood by those skilled in the art that the displays can be constructed to emit two selected colors. For example, the light-emitting devices can emit a first color and a phosphor can emit a second color.

Figure 7:
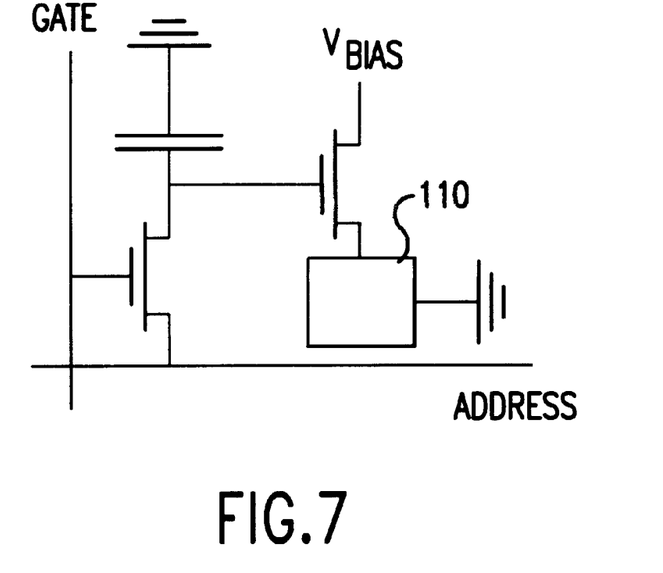
FIG. 7 is an exemplary schematic circuit diagram of one pixel in an active matrix array of the full-color displays shown in FIGS. 4, 5 and 6.

FIG. 7 illustrates a schematic circuit diagram for one pixel in an active matrix color display according to this invention. The pixel comprises a light-emitting device 110 according to this invention.

In one exemplary embodiment of the methods for forming the light-emitting devices according to this invention, an amorphous GaN layer was deposited on a quartz substrate by MOCVD at a temperature of about 550° C. The amorphous layer was subsequently solid-phase crystallized by using an excimer laser. A single pulse with a laser fluence of 142 mJ/cm$^2$ was used during crystallization.

Figure 8:
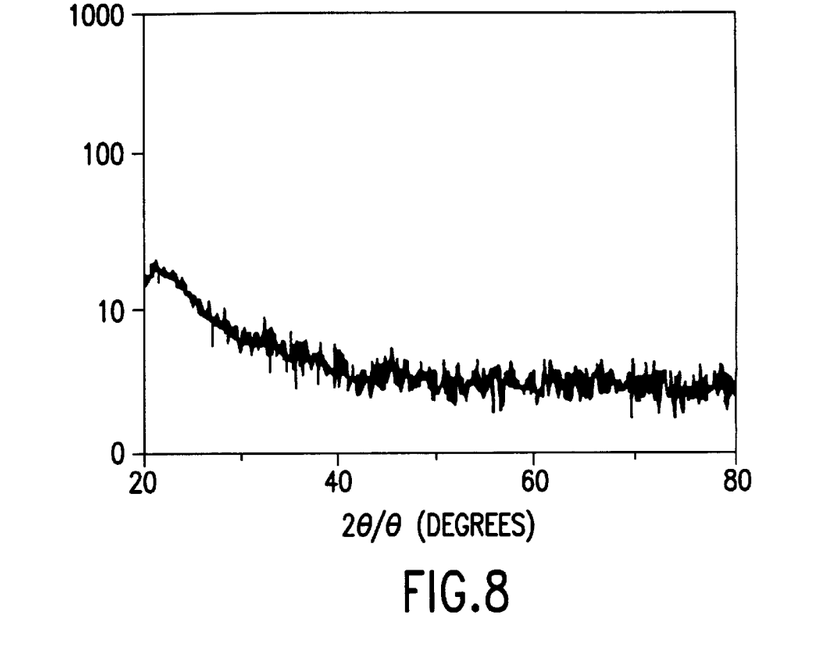
FIG. 8 shows the x-ray diffraction spectrum ($2\theta/\theta$ scan) of amorphous GaN deposited on quartz substrate.
Figure 9:
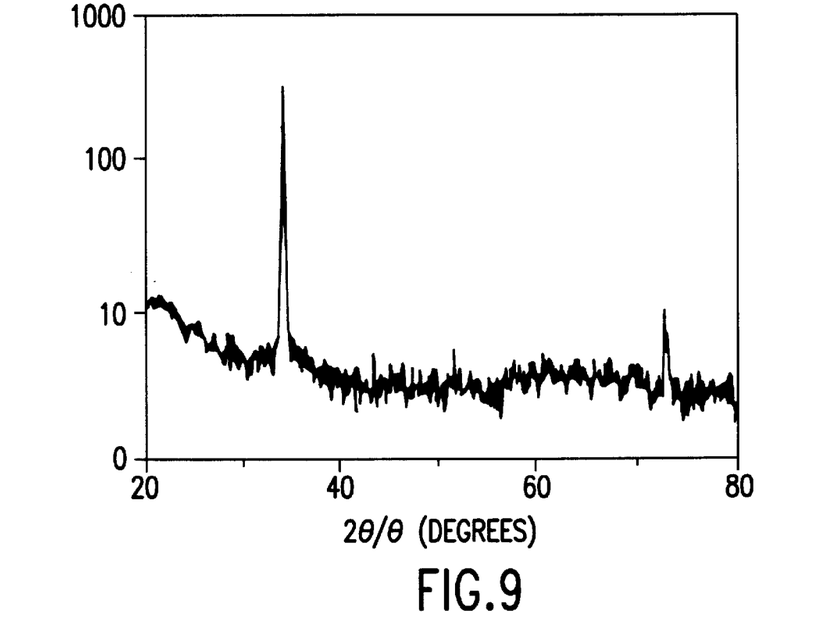
FIG. 9 shows the x-ray diffraction spectrum of laser-crystallized GaN deposited on a quartz substrate according to this invention, showing GaN (002) and (004) peaks.

FIGS. 8 and 9 show x-ray diffraction spectrums (2θ/θ scans) of amorphous GaN and laser-crystallized polycrystalline GaN, respectively, formed according to this exemplary method. FIG. 9 shows two peaks for the polycrystalline GaN material. These peaks were identified as GaN (002) and GaN (004).

These experimental results demonstrate that amorphous GaN can be crystallized using an excimer laser to form polycrystalline GaN.

In another exemplary embodiment of the methods for forming the light-emitting devices according to this invention, polycrystalline GaN was deposited directly on a quartz substrate by growth at a high temperature of 1050° C. Polycrystalline GaN film growth on quartz followed a deposition sequence including the initial formation of an AlN nucleation layer on the quartz substrate. The AlN nucleation layer was applied to compensate for the low sticking coefficient of gallium nitride on quartz. The AlN nucleation layer was applied as a thin sub-monolayer film on a portion of the substrate. A thin amorphous GaN buffer layer was then deposited on the nucleation layer at a temperature of about 550° C. The amorphous GaN buffer layer had a thickness of about 300 Å. The GaN buffer layer was solid-phase crystallized by increasing the temperature to about 1050° C. in a $NH_3:H_2$ ambient atmosphere. Subsequently, thick polycrystalline GaN were deposited on the crystallized GaN buffer layer to form a layered semiconductor structure.

The structural properties of the polycrystalline GaN structure were very similar to those of the laser crystallized material. In addition, the structure displayed photoluminescence comparable to that of epitaxial GaN films grown on sapphire.

In another exemplary embodiment of the methods for forming the light-emitting devices according to this invention, a polycrystalline GaN device structure was formed by using the same technique described above. Particularly, an AlN nucleation layer and a GaN buffer layer were initially grown on a quartz substrate. Next, an LED structure was formed by growing p-type and n-type layers on the GaN buffer layer. Particularly, a Si-doped n-type GaN layer was grown at a temperature of about 1050° C. on the GaN buffer layer. A thin $In_{0.3}Ga_{0.7}N$ (estimated composition) single quantum well active layer was grown on the n-type GaN layer. The n-type GaN layer had a thickness of about 4 μm and the In$_{0.3}$Ga$_{0.7}$N had a thickness of about 30 Å. Finally, a Mg-doped p-type GaN layer having a thickness of about 0.2 μm was formed on the In$_{0.3}$Ga$_{0.7}$N layer.

Figure 10:
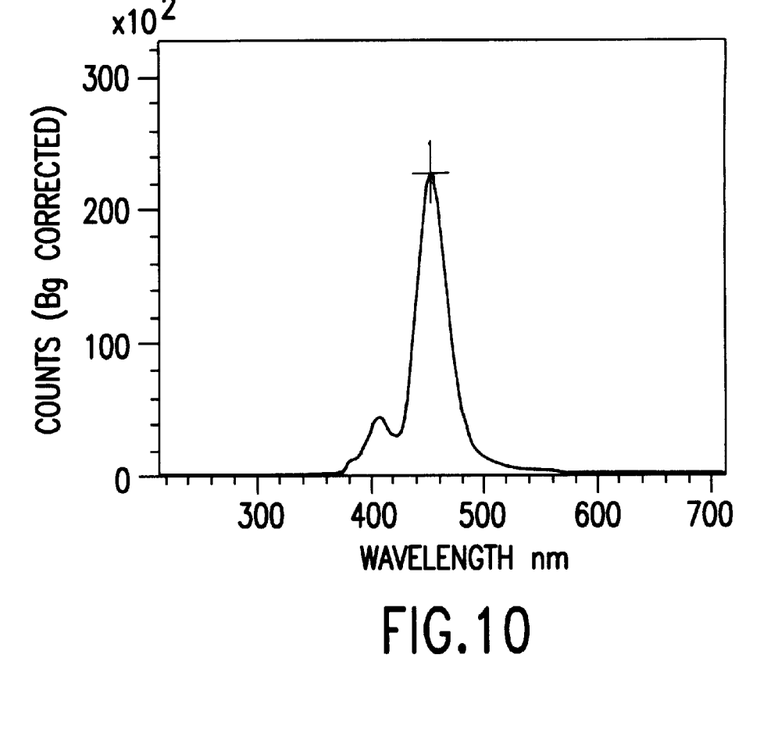
FIG. 10 is a plot of luminescence versus wavelength of a light-emitting device including a polycrystalline GaN structure according to this invention.

FIG. 10 shows the emitted light intensity as a function of wavelength for the polycrystalline GaN LED structure. As shown, the LED emitted blue light.

A single-crystal LED reference sample was simultaneously grown on a c-oriented sapphire substrate, for comparison of structural and performance characteristics to the polycrystalline structure.

From these materials, LEDs were fabricated by evaporating Ti/Au p-contact metal, patterning the metal into ~500 μm dots on 1 m centers, and argon-ion milling surrounding material. The etch depth was about 1 μm, as is typical for epitaxial LEDs grown on sapphire substrates, to expose the underlying n-type material. For LED operation, the n-type contact was made by touching a metal probe tip to the n-type GaN layer surface.

Unlike the specular surface typically obtained for single crystal LED material grown on single crystal sapphire substrates, the surface of the polycrystalline material grown over a quartz substrate was quite rough. Because of this irregular surface, the p-n junction may not have been removed uniformly by the ion milling. Furthermore, this surface morphology made the nature of the p-type GaN/metal contact ambiguous, as the relatively thin layer of p-type GaN may not have completely coated each of the crystallites.

Figure 11:
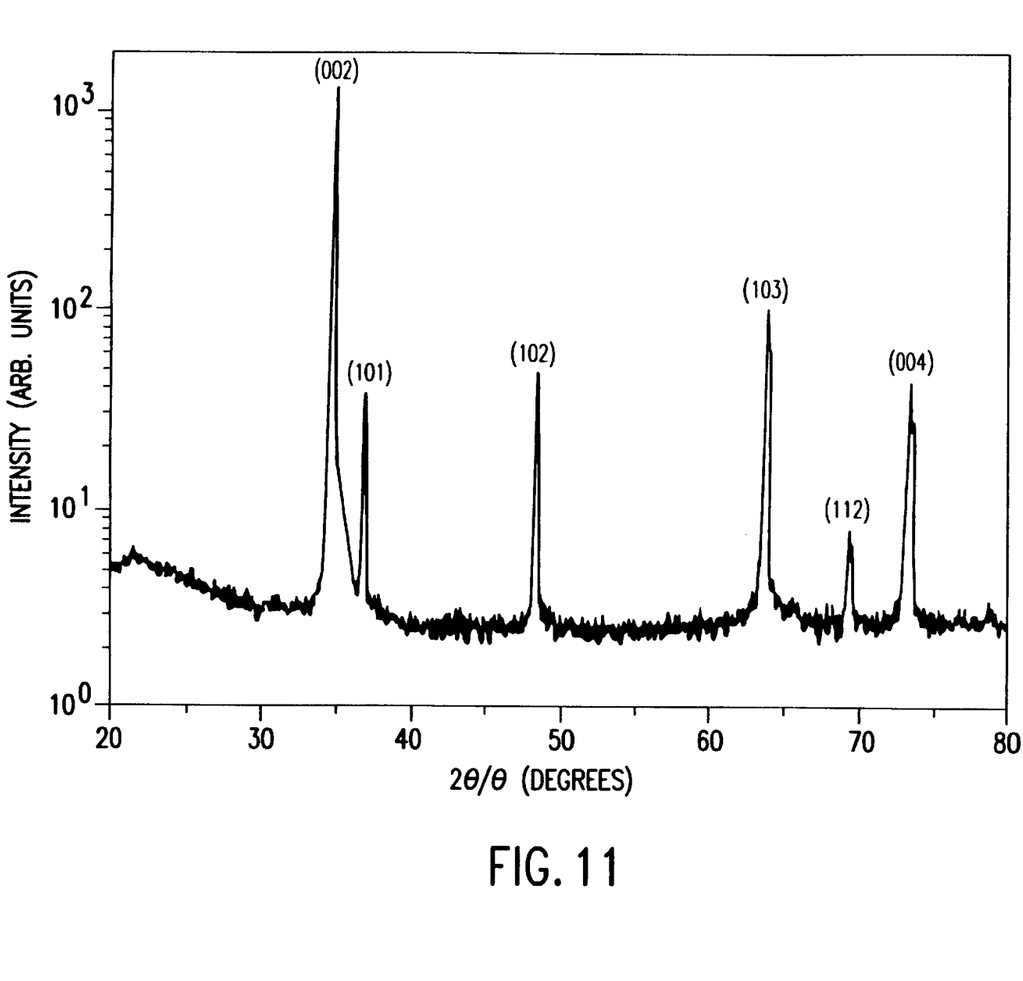
FIG. 11 shows the x-ray diffraction spectrum of a polycrystalline InGaN light-emitting device own on a quartz substrate according to this invention.

A scanning electron microscope (SEM) image of the surface showed that the typical size of the crystals was several microns, or about the same order as the film thickness. Furthermore, the presence of flat-topped, hexagon-cross section crystallites suggests that there is a tendency toward growth in a c-orientation. This preferred orientation is likewise evident in the x-ray diffraction spectrum, shown in FIG. 11, which contains a (002) reflection that is strong compared to the intensity expected for an array of randomly-oriented polycrystals.

In Table 1 below, the measured diffracted intensities are compared with tabulated values corresponding to perfectly random polycrystals (Joint Committee on Powder Diffraction Standards (JPCPDS) (1976)). In each case, the intensities are normalized to the (101) reflection, because it is expected to be the strongest reflection from a random assembly of crystallites. Table 1 shows that the (002) reflection is especially pronounced, indicating a preferred c-orientation for the group III-nitride films grown on the quartz substrate. Accordingly, the (004) reflection is also relatively strong, and several of the assymetric reflections are absent in the measured spectrum.

TABLE 1

| Angle (2θ) | Index | Measured I/I$_{(101)}$ | JCPDSI/I$_{(101)}$ |
|---|---|---|---|
| 32.41° | (100) | 0 | 70 |
| 34.56° | (002) | 3521 | 50 |
| 36.82° | (101) | 100 | 100 |
| 48.09° | (102) | 116 | 60 |
| 57.91° | (110) | 0 | 90 |
| 63.42° | (103) | 258 | 80 |
| 67.75° | (200) | 0 | 20 |
| 69.17° | (112) | 21 | 80 |
| 70.60° | (201) | 0 | 70 |
| 72.88° | (004) | 116 | 20 |
| 78.38° | (202) | 0 | 50 |

Figure 12:
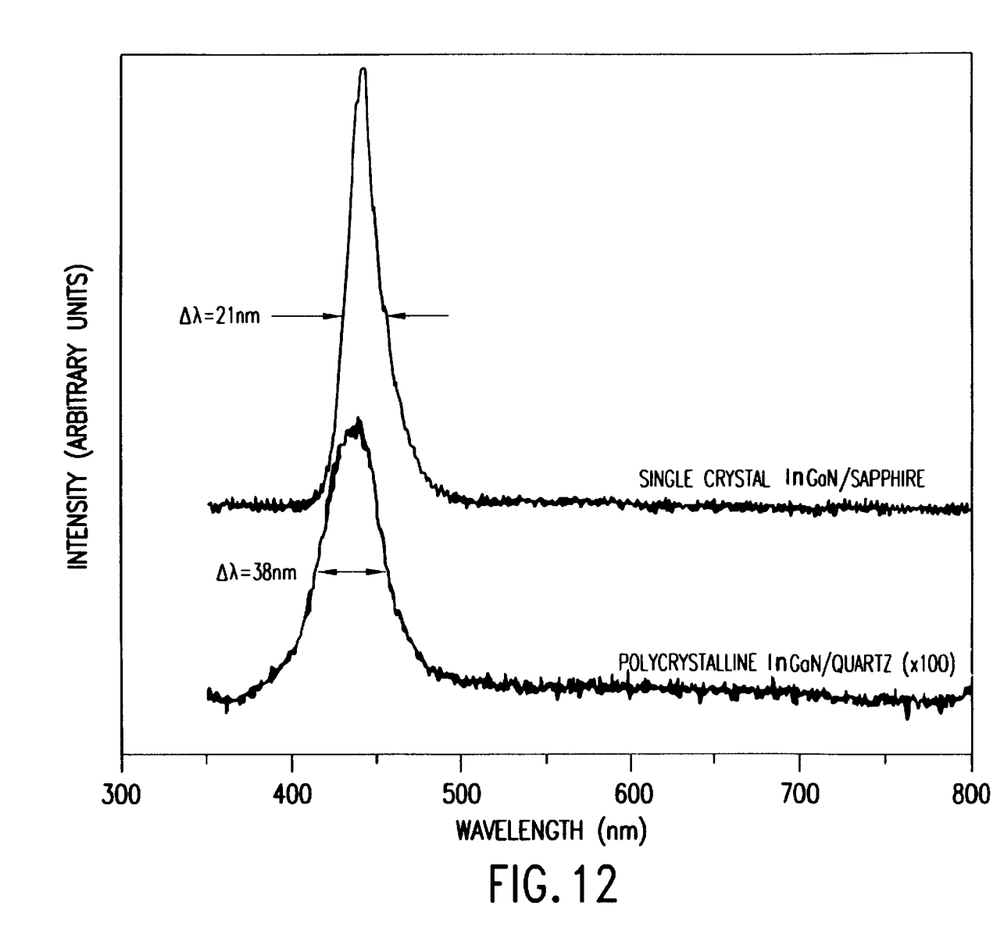
FIG. 12 illustrates the emission spectra of InGaN light-emitting devices for a single crystal LED grown epitaxially on a c-face sapphire substrate and for a polycrystalline light-emitting device deposited on a quartz substrate according to this invention.

Although the orientation of the polycrystals was not completely random, the structure was still highly disordered, such that many natural growth faces were still exposed during growth of the InGaN quantum well (QW). Because the growth rate and alloy composition are influenced by the plane upon which a layer is grown, it is natural to expect a range of quantum well parameters among the polycrystals, broader than the distribution which occurs for single-crystal LEDs. Such a range of quantum well thickness and composition should translate into less spectral purity for the LED emission. This was evident in FIG. 12, which shows a comparison of the emission collected through the substrate, of the single crystal LED (sapphire substrate) and the polycrystalline LED (quartz substrate) from the same growth run. While both spectra peak at ~430 nm, the spectral width of the polycrystalline LED is nearly double that of the single-crystal LED.

Compared to the single-crystal LED, the detected emission was approximately 100 times less intense for the polycrystalline device. Despite relatively weak electroluminescence from the polycrystalline LEDs, several factors may have inhibited a meaningful comparison of the emission efficiency for the two kinds of LEDs. It is believed that the non-optimized contact arrangement, along with a poorly-defined current path in the polycrystalline LEDs, may have contributed to their low efficiency. For instance, the injection path is well-confined in the single crystal LEDs, such that light is emitted only under the p-contact. In contrast, the emission pattern from the polycrystals was much more complicated, with many bright emission spots observed in the region between the two contacts. This distributed emission was not effectively collected by a fiber-coupled spectrometer, thus contributing to the apparent inefficiency indicated by FIG. 12.

Such a scattered emission pattern may not be so unusual, however, for LEDs constructed from polycrystalline material. The multitude of grain boundaries present in polycrystalline films forces the injected current to traverse a complicated path through the crystallites, in order to be injected across the junction and into the InGaN quantum well. Consequently, when viewed with a microscope, the emission contains many small, bright spots, both between and around the two contacts, corresponding to such a percolation path assumed by the diode current. Additionally, the function of the metal contacts is also questionable in this simple structure, because LED operation was observed whether the n-type contact was chosen to be one of the Ti/Au dots or a probe tip touched directly onto the etched regions.

From these emission spots between the contacts, and the lack of any substantial difference between an n-contact placed on the etched versus as-grown surfaces, it is apparent that the etching step did not completely penetrate through the p-n junction in all the crystallites.

Further optimization of the device structure, including more sophisticated etching to more uniformly remove the junction, and/or further patterning of the material to define a current injection path, may contribute to more efficient luminescence from these polycrystalline devices.

While this invention has been described in conjunction with the specific embodiments described above, it is evident that many alternatives, modifications and variations are apparent to those skilled in the art in view of this disclosure. Accordingly, the preferred embodiments of this invention as set forth above are intended to be illustrative and not limiting. Various changes can be made without departing from the spirit and scope of this invention.

What is claimed is:

1. A semiconductor structure, comprising:
    a polycrystalline, substantially non-crystalline or amorphous substrate;

a group III-nitride wetting layer formed on the substrate; and at least one polycrystalline group III-nitride layer formed over the wetting layer.

2. The semiconductor structure of claim 1, further comprising a group III-nitride buffer layer formed on the wetting layer.

3. The semiconductor structure of claim 1, wherein the at least one group III-nitride layer comprises at least one GaN layer.

4. The semiconductor structure of claim 1, wherein the at least one group III-nitride layer comprises at least one GaN layer and a group III-nitride active layer.

5. The semiconductor structure of claim 4, further comprising at least one group III-nitride carrier confinement layer above or below the group III-nitride active layer.

6. A light-emitting device comprising the semiconductor structure of claim 1.

7. A light-emitting diode, comprising:

a polycrystalline, substantially non-crystalline or amorphous substrate;

a p-type polycrystalline group III-nitride layer formed over the substrate; and an n-type polycrystalline group III-nitride layer formed over the substrate.

8. The light-emitting diode of claim 7, further comprising a group III-nitride wetting layer formed between the substrate and the p-type and n-type polycrystalline group III-nitride layers.

9. The light-emitting diode of claim 8, wherein the wetting layer comprises a sub-monolayer of the group III-nitride.

10. The light-emitting diode of claim 7, further comprising a group III-nitride wetting layer formed on the substrate.

11. The light-emitting diode of claim 10, further comprising a group III-nitride active layer formed between the p-type and n-type polycrystalline group III-nitride layers.

12. The light-emitting diode of claim 11, further comprising at least one group III-nitride carrier confinement layer above or below the group III-nitride active layer.

13. The light-emitting diode of claim 7, wherein the p-type and n-type polycrystalline group III-nitride layers comprise GaN.

14. A display, comprising:

a polycrystalline, substantially non-crystalline or amorphous substrate having a first surface and a second surface; and a plurality of light-emitting diodes formed on the first surface of the substrate, each light-emitting diode including:

a p-type polycrystalline group III-nitride layer formed over the first surface of the substrate; and an n-type polycrystalline group III-nitride layer formed over the substrate;

wherein the light-emitting diode emits light of a selected wavelength.

15. The display of claim 14, further comprising:

at least two phosphors emitting at different wavelengths formed over the light-emitting diode or over the second surface of the substrate;

wherein the light-emitting diodes emit light of a wavelength effective to excite the at least two phosphors such that the display emits at least one of blue, green and red light.

16. The display of claim 15, wherein the at least two phosphors comprise:

red, green and blue phosphors; and the light-emitting diodes emit light of a wavelength effective to excite the red, green and blue phosphors to emit red, green and blue light, respectively.

17. The display of claim 15, wherein the at least two phosphors comprise:

red and green phosphors; and the light-emitting diodes emit blue light that excites the red and green phosphors to emit red and green light, respectively, such that the display emits red, green and blue light.

18. The display of claim 14, wherein the substrate comprises a light-transparent material.

19. The display of claim 14, wherein the light-emitting diodes further comprise a group III-nitride wetting layer formed on the first surface of the substrate.

20. The display of claim 19, wherein the wetting layer comprises a sub-monolayer of the group III-nitride.

21. The display of claim 14, wherein the light-emitting diodes further comprise a group III-nitride active layer formed between the p-type and n-type polycrystalline group III-nitride layers.

22. The display of claim 21, wherein the light-emitting diodes further comprise at least one group III-nitride carrier confinement layer above or below the group III-nitride active layer.

23. The display of claim 14, wherein the p-type and n-type polycrystalline group III-nitride layers comprise GaN.

24. The display of claim 23, wherein the light-emitting diodes further comprise an InGaN active layer formed between the p-type and n-type polycrystalline group III-nitride layers.

25. A method of making a semiconductor structure, comprising:

providing a polycrystalline, substantially non-crystalline or amorphous substrate;

forming a group-II-nitride wetting layer on the substrate; and forming at least one polycrystalline group III-nitride layer over the Group III-nitride wetting layer.

26. The method of claim 25, wherein the at least one polycrystalline group III-nitride layer is formed on the substrate by depositing amorphous group III-nitride material on the substrate, and subsequently solid-phase crystallizing the amorphous group III-nitride material to form the polycrystalline group III-nitride layer.

27. The method of claim 26, wherein the amorphous group III-nitride layer is solid-phase crystallized using a laser.

28. The method of claim 25, wherein one of the at least one polycrystalline group III-nitride layer is formed on the wetting layer.

29. The method of claim 28, wherein the wetting layer is formed as a sub-monolayer on the substrate.

30. The method of claim 25, wherein the group III-nitride is GaN.

31. The method of claim 25, wherein the semiconductor structure is a light-emitting diode.

32. A method of making a light-emitting diode, comprising:

providing a polycrystalline, substantially non-crystalline or amorphous substrate;

forming a p-type polycrystalline group III-nitride layer over the substrate; and forming an n-type polycrystalline group III-nitride layer over the substrate.

33. The method of claim 32, further comprising forming a group III-nitride wetting layer over the substrate prior to forming the p-type and n-type polycrystalline group III-nitride layers.

34. The method of claim 33, wherein the wetting layer comprises a sub-monolayer of the group III-nitride.

35. The method of claim 32, further comprising forming a group III-nitride active layer between the p-type and n-type polycrystalline group III-nitride layers.

36. The method of claim 35, further comprising forming at least one group III-nitride carrier confinement layer.

37. The method of claim 32, wherein the p-type and n-type polycrystalline group III-nitride layers comprise GaN.

38. A method of making a display, comprising:
   providing a polycrystalline, substantially non-crystalline or amorphous substrate having a first surface and a second surface; and
   forming each of an array of light-emitting diodes on the first surface of the substrate by:
      forming a p-type polycrystalline group III-nitride layer over the substrate; and
      forming an n-type polycrystalline group III-nitride layer over the substrate,
      wherein each of the array of light-emitting diodes emit light of a selected wavelength.

39. The method of claim 38, further comprising:
   forming at least two phosphors that emit at different wavelengths and absorb at the selected wavelength, over the light-emitting diode or over the second surface of the substrate,
   wherein each light-emitting diode emits light of the selected wavelength to excite the at least two phosphors.

40. The method of claim 39, wherein the at least two phosphors comprise:
   red, green and blue phosphors; and
   the light-emitting diodes emit light of the selected wavelength that excites the red, green and blue phosphors to emit red, green and blue light, respectively.

41. The method of claim 39, wherein the at least two phosphors comprise:
   red and green phosphors; and
   a portion of the light-emitting diodes emit blue light that excites the red and green phosphors to emit red and green light, respectively, such that the display emits red, green and blue light.

42. The method of claim 38, wherein forming the array of light-emitting diodes further comprises forming a group III-nitride wetting layer on first surface of the substrate.

43. The method of claim 38, wherein forming the array of light-emitting diodes further comprises forming a group III-nitride active layer between the p-type and n-type polycrystalline group III-nitride layers.

44. The method of claim 43, wherein forming the array of light-emitting diodes further comprises forming a group III-nitride carrier confinement layer on at least one surface of the active layer.

45. The method of claim 38, wherein the group III-nitride is GaN.

* * * * *